(12) United States Patent
Jain et al.

(10) Patent No.: US 9,893,063 B2
(45) Date of Patent: *Feb. 13, 2018

(54) SPECIAL CONSTRUCT FOR CONTINUOUS NON-UNIFORM ACTIVE REGION FINFET STANDARD CELLS

(71) Applicant: GLOBALFOUNDRIES Inc., Grand Cayman (KY)

(72) Inventors: Navneet Jain, Milpitas, CA (US); Juhan Kim, Santa Clara, CA (US); Andy Nguyen, San Jose, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/420,967

(22) Filed: Jan. 31, 2017

(65) Prior Publication Data

US 2017/0141109 A1 May 18, 2017

Related U.S. Application Data

(62) Division of application No. 15/063,563, filed on Mar. 8, 2016, now Pat. No. 9,634,003, which is a division
(Continued)

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
CPC ..... H01L 21/823418; H01L 21/823431; H01L 21/823475; H01L 21/823821;
(Continued)

(56) References Cited

U.S. PATENT DOCUMENTS 6,410,972 B1 6/2002 Sei et al.
7,187,029 B2 3/2007 Sugita et al.
(Continued)

*Primary Examiner* — Shahed Ahmed
(74) *Attorney, Agent, or Firm* — Ditthavong & Steiner, P.C.

(57) ABSTRACT

Methods for abutting two cells with different sized diffusion regions and the resulting devices are provided. Embodiments include abutting a first cell having first drain and source diffusion regions and a second cell having second drain and source diffusion regions, larger than the first diffusion regions, by: forming a dummy gate at a boundary between the two cells; forming a continuous drain diffusion region having an upper portion crossing the dummy gate and encompassing the entire first drain diffusion region and part of the second drain diffusion region and having a lower portion beginning over the dummy gate and encompassing a remainder of the second drain diffusion region; forming a continuous source diffusion region that is the mirror image of the continuous drain diffusion region; and forming a poly-cut mask over the dummy gate between, but separated from, the continuous drain and source diffusion regions.

11 Claims, 7 Drawing Sheets

Related U.S. Application Data of application No. 14/610,260, filed on Jan. 30, 2015, now Pat. No. 9,337,099.

(51) Int. Cl.

| | |
|---|---|
| *H01L 21/8238* | (2006.01) |
| *H01L 23/528* | (2006.01) |
| *H01L 27/02* | (2006.01) |
| *H01L 29/08* | (2006.01) |
| *H01L 29/66* | (2006.01) |

(52) U.S. Cl.
CPC ........... *H01L 21/823475* (2013.01); *H01L 21/823821* (2013.01); *H01L 23/528* (2013.01); *H01L 27/0207* (2013.01); *H01L 29/0847* (2013.01); *H01L 29/66545* (2013.01); *H01L 29/66795* (2013.01)

(58) Field of Classification Search
CPC .............. H01L 23/528; H01L 27/0886; H01L 27/0207; H01L 29/0847; H01L 29/66545; H01L 29/66795; H01L 2924/0002
USPC ........ 257/206, 368, 369, 288, 401; 438/151, 438/197, 275, 597, 599, 618, 128, 233
See application file for complete search history.

(56) References Cited

U.S. PATENT DOCUMENTS

| | | | |
|---|---|---|---|
| 2007/0290270 A1 | 12/2007 | Ko et al. | |
| 2014/0077380 A1* | 3/2014 | Kim ................ | H01L 23/5386 257/773 |
| 2015/0356225 A1 | 12/2015 | Lu et al. | |

\* cited by examiner

BACKGROUND

BACKGROUND

BACKGROUND

SPECIAL CONSTRUCT FOR CONTINUOUS NON-UNIFORM ACTIVE REGION FINFET STANDARD CELLS

RELATED APPLICATION

The present application is a Divisional of application Ser. No. 15/063,563, filed on Mar. 8, 2016, which is a Divisional of application Ser. No. 14/610,260, filed on Jan. 30, 2015, now U.S. Pat. No. 9,337,099, which are incorporated herein by reference in their entirety.

TECHNICAL FIELD

The present disclosure relates to special constructs for FinFET standard cells. In particular, the present disclosure relates to special constructs for continuous non-uniform active region FinFET standard cells.

BACKGROUND

Various layouts for cell circuits have been developed for semiconductor devices with linear-shaped diffusion fins, i.e. FinFET devices. An exemplary cell layout incorporating FinFETs is shown in FIG. 1. In this figure, the cell layout 101 includes diffusion regions 103 from which a number of linear, parallel fins 105 protrude from the substrate and extend in the direction of the cell width. The diffusion regions 103 and fins 105 together form the active regions 107. The cell layout 101 also includes a number of linear gate electrodes 109 that extend along the direction of the cell height in a perpendicular direction to the fins 105, and which wrap over the fins 105 and are electrically isolated from the fins by a gate oxide material (not shown). Various contacts are oriented perpendicular to the fins 105 but parallel to the gate electrodes 109, for example interconnect structures 111 for a source voltage 113 and 115, which are part of the metal 1 (M1) layer. In addition, the gate electrodes 109 cross-couple transistors formed from the upper and lower diffusion regions 103 through interconnect structures 119 for the drain voltage, which are connected through vias 117 to M1 layer segment 121. Two or more dummy gates 123 are formed at the edges of the cell.

As shown in FIG. 2A, two or more standard cells can be abutted into a single cell layout 201A in order to reduce the area of the layout and increase the number of transistors for a FinFET device. The cell layout 201A includes diffusion regions 103, fins 105, active regions 107, gate electrodes 109, interconnect structures 111 for the source voltage, source voltage 113 and 115 (which are part of the M1 layer), vias 117, interconnect structures 119 for the drain voltage, M1 layer segment 121, and three dummy gates 123. The diffusion regions 103 from the two cells meet in the middle of a dummy gate 123. However, the different height or number of fins 105 between the two abutted cells provides a non-uniform active region 107, resulting in a jog pattern in the active regions.

If the two diffusion regions are at different potentials, the jog pattern can be problematic due to leakage issues resulting in a discontinuous potential across the active regions. To solve the leakage problem, cell layout 201A has an active region cut 203 that separates the two cells over the dummy gate 123 where the two cells meet. The active region cut 203 causes a single diffusion break (SDB) 205. However, the contact region between the fins with the gate electrode is then reduced since the active region is rounded after lithography.

Alternatively, two cells may be abutted with a double diffusion break (DDB) to avoid the jog in the active regions, as illustrated in FIG. 2B. The cell layout 201B includes diffusion regions 103, fins 105, active regions 107, gate electrodes 109, interconnect structures 111 for the source voltage 113 and 115 (which are part of the M1 layer), vias 117, interconnect structures 119 for the drain voltage, M1 layer segment 121, and dummy gates 123. However, the cell layout 201B includes two dummy gates 123 with a DDB 207 therebetween where one cell abuts the other, and each diffusion region 103 goes to the edge of a dummy gate 123, thereby increasing the contact area. Although the DDB 207 avoids the leakage issues and the reduction in contact area after photolithography, the area is increased.

A need therefore exists for methodology enabling the production of layouts with continuous non-uniform active regions for FinFET standard cells and the resulting devices.

SUMMARY

An aspect of the present disclosure relates to methods for abutting two cells with different sized active regions by forming continuous active regions by matching source regions with source regions and drain regions with drain regions and forming a poly-cut mask between the source and drain regions on the dummy gate where the cells meet.

Another aspect relates to a device having two cells abutting each other with continuous active regions and a gate cut mask between source and drain regions over the dummy gate where the cells meet.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: abutting a first cell having a first drain diffusion region and a first source diffusion region and a second cell having a second drain diffusion region and a second source diffusion region, the first diffusion regions being smaller than the second diffusion regions, by: forming a dummy gate at a boundary between the first and second cells; forming a continuous drain diffusion region having an upper portion crossing the dummy gate and encompassing the entire first drain diffusion region and part of the second drain diffusion region and having a lower portion beginning over the dummy gate and encompassing a remainder of the second drain diffusion region; forming a continuous source diffusion region having a lower portion crossing the dummy gate and encompassing the entire first source diffusion region and part of the second source diffusion region and having an upper portion beginning over the dummy gate and encompassing a remainder of the second source diffusion region; and forming a poly-cut mask over the dummy gate between, but separated from, the continuous drain diffusion region and the continuous source diffusion region.

Aspects of the present disclosure also include having the lower portion of the continuous drain diffusion region and the upper portion of the continuous source diffusion region begin at an edge of the dummy gate and across the dummy gate. Other aspects include forming a first set of continuous fins across the upper portion of the continuous drain diffusion region, a second set of continuous fins across the lower portion of the continuous source diffusion region, a third set of fins across the lower portion of the continuous drain diffusion region, a fourth set of fins across the upper portion of the continuous source diffusion region, wherein the third and fourth sets are cut at the edge of the dummy gate. Still other aspects include forming a first gate contact over the dummy gate connecting a first source power line interconnect from the first cell to a first source power line interconnect from the second cell and a second gate contact over the dummy gate connecting a second source power line interconnect from the first cell to a second source power line interconnect from the second cell. Further aspects include having the lower portion of the continuous drain diffusion region and the upper portion of the continuous source diffusion region begin in the middle of the dummy gate and continue across the dummy gate. Still further aspects include forming a first set of continuous fins across the upper portion of the continuous drain diffusion region, a second set of continuous fins across the lower portion of the continuous source diffusion region, a third set of fins across the lower portion of the continuous drain diffusion region, a fourth set of fins across the upper portion of the continuous source diffusion region, wherein the third and fourth sets are cut at the middle of the dummy gate. Other aspects include forming a first gate contact over the dummy gate connecting a first source power line interconnect from the first cell to a first source power line interconnect from the second cell and a second gate contact over the dummy gate connecting a second source power line interconnect from the first cell to a second source power line interconnect from the second cell. Still other aspects include having the first cell and the second cell at the same potential.

According to the present disclosure, some technical effects may be achieved in part by a device including: a first cell and a second cell adjacent the first cell; a dummy gate at a boundary between the first and second cells; a continuous drain diffusion region having an upper portion crossing the dummy gate and encompassing an entire drain diffusion region for the first cell and part of a drain diffusion region for the second cell and having a lower portion beginning over the dummy gate and encompassing a remainder of a drain diffusion region for the second cell; a continuous source diffusion region having a lower portion crossing the dummy gate and encompassing an entire source diffusion region for the first cell and part of a source diffusion region for the second cell and having an upper portion beginning over the dummy gate and encompassing a remainder of the source diffusion region for the second cell; and a poly-cut mask over the dummy gate between, but separated from, the continuous drain diffusion region and the continuous source diffusion region.

Aspects of the present disclosure also include having the lower portion of the continuous drain diffusion region and the upper portion of the continuous source diffusion region begin at an edge of the dummy gate and across the dummy gate. Other aspects include having a first set of continuous fins across the upper portion of the continuous drain diffusion region, a second set of continuous fins across the lower portion of the continuous source diffusion region, a third set of fins across the lower portion of the continuous drain diffusion region, a fourth set of fins across the upper portion of the continuous source diffusion region, wherein the third and fourth sets are cut at the edge of the dummy gate. Still other aspects include having a first gate contact over the dummy gate connecting a first source power line interconnect from the first cell to a first source power line interconnect from the second cell and a second gate contact over the dummy gate connecting a second source power line interconnect from the first cell to a second source power line interconnect from the second cell. Further aspects include having the lower portion of the continuous drain diffusion region and the upper portion of the continuous source diffusion region begin in the middle of the dummy gate and continue across the dummy gate. Still further aspects include having a first set of continuous fins across the upper portion of the continuous drain diffusion region, a second set of continuous fins across the lower portion of the continuous source diffusion region, a third set of fins across the lower portion of the continuous drain diffusion region, a fourth set of fins across the upper portion of the continuous source diffusion region, wherein the third and fourth sets are cut at the middle of the dummy gate. Other aspects include forming a first gate contact over the dummy gate connecting a first source power line interconnect from the first cell to a first source power line interconnect from the second cell and a second gate contact over the dummy gate connecting a second source power line interconnect from the first cell to a second source power line interconnect from the second cell. Still other aspects include having the first cell and the second cell at the same potential.

According to the present disclosure, some technical effects may be achieved in part by a method including: abutting a first cell having a first drain diffusion region and a first source diffusion region and a second cell having a second drain diffusion region and a second source diffusion region, the first diffusion regions being smaller than the second diffusion regions, by: forming a first dummy gate at a boundary between the first and second cells; forming a second dummy gate at an opposite edge of the first cell and a third dummy gate at an opposite edge of the second cell; forming a continuous drain diffusion region having an upper portion over the second and third dummy gates and therebetween, crossing the first dummy gate and encompassing the entire first drain diffusion region and part of the second drain diffusion region, and having a lower portion beginning over the first dummy gate and encompassing a remainder of the second drain diffusion region; forming a continuous source diffusion region having a lower portion over the second and third dummy gates and therebetween, crossing the first dummy gate and encompassing the entire first source diffusion region and part of the second source diffusion region, and having an upper portion beginning over the first dummy gate and encompassing a remainder of the second source diffusion region; and forming a poly-cut mask over the first dummy gate between, but separated from, the continuous drain diffusion region and the continuous source diffusion region.

Aspects of the present disclosure also include having the first cell and the second cell at the same potential. Other aspects include having the lower portion of the continuous drain diffusion region and the upper portion of the continuous source diffusion region begin at an edge of the first dummy gate and across the first dummy gate, by: forming a first set of continuous fins across the upper portion of the continuous drain diffusion region, a second set of continuous fins across the lower portion of the continuous source diffusion region, a third set of fins across the lower portion of the continuous drain diffusion region, and a fourth set of fins across the upper portion of the continuous source diffusion region, wherein the third and fourth sets are cut at the edge of the first dummy gate; and forming a first gate contact over the first dummy gate connecting a first source power line interconnect from the first cell to a first source power line interconnect from the second cell and a second gate contact over the first dummy gate connecting a second source power line interconnect from the first cell to a second source power line interconnect from the second cell. Still other aspects include having the lower portion of the continuous drain diffusion region and the upper portion of the continuous source diffusion region begin in the middle of the first dummy gate and continue across the first dummy gate, by: forming a first set of continuous fins across the upper portion of the continuous drain diffusion region, a second set of continuous fins across the lower portion of the continuous source diffusion region, a third set of fins across the lower portion of the continuous drain diffusion region, and a fourth set of fins across the upper portion of the continuous source diffusion region, wherein the third and fourth sets are cut at the middle of the first dummy gate; and forming a first gate contact over the first dummy gate connecting a first source power line interconnect from the first cell to a first source power line interconnect from the second cell and a second gate contact over the first dummy gate connecting a second source power line interconnect from the first cell to a second source power line interconnect from the second cell.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of leakage resulting in a discontinuous potential and reduced contact areas attendant upon abutting two cells with non-uniform active regions. To reduce the cell layout and increase the number of transistors for a FinFET device while maintaining a continuous potential across the active regions, a method in accordance with embodiments of the present disclosure includes abutting a first cell having a first drain diffusion region and a first source diffusion region and a second cell having a second drain diffusion region and a second source diffusion region, the first diffusion regions being smaller than the second diffusion regions, by: forming a dummy gate at a boundary between the first and second cells; forming a continuous drain diffusion region having an upper portion crossing the dummy gate and encompassing the entire first drain diffusion region and part of the second drain diffusion region and having a lower portion beginning over the dummy gate and encompassing a remainder of the second drain diffusion region; forming a continuous source diffusion region having a lower portion crossing the dummy gate and encompassing the entire first source diffusion region and part of the second source diffusion region and having an upper portion beginning over the dummy gate and encompassing a remainder of the second source diffusion region; and forming a poly-cut mask over the dummy gate between, but separated from, the continuous drain diffusion region and the continuous source diffusion region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
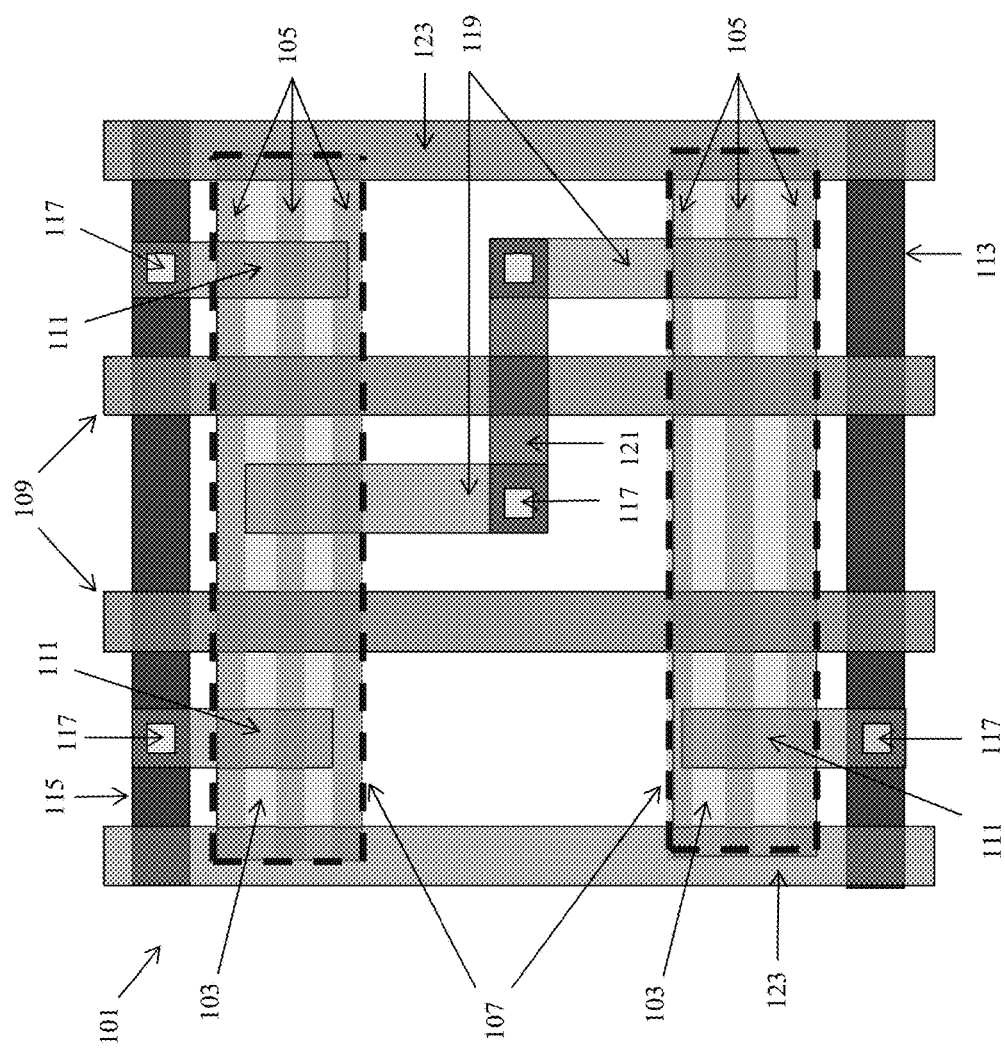
FIG. 1 illustrates a top-view of a standard cell layout for a conventional FinFET device.
Figure 2A:
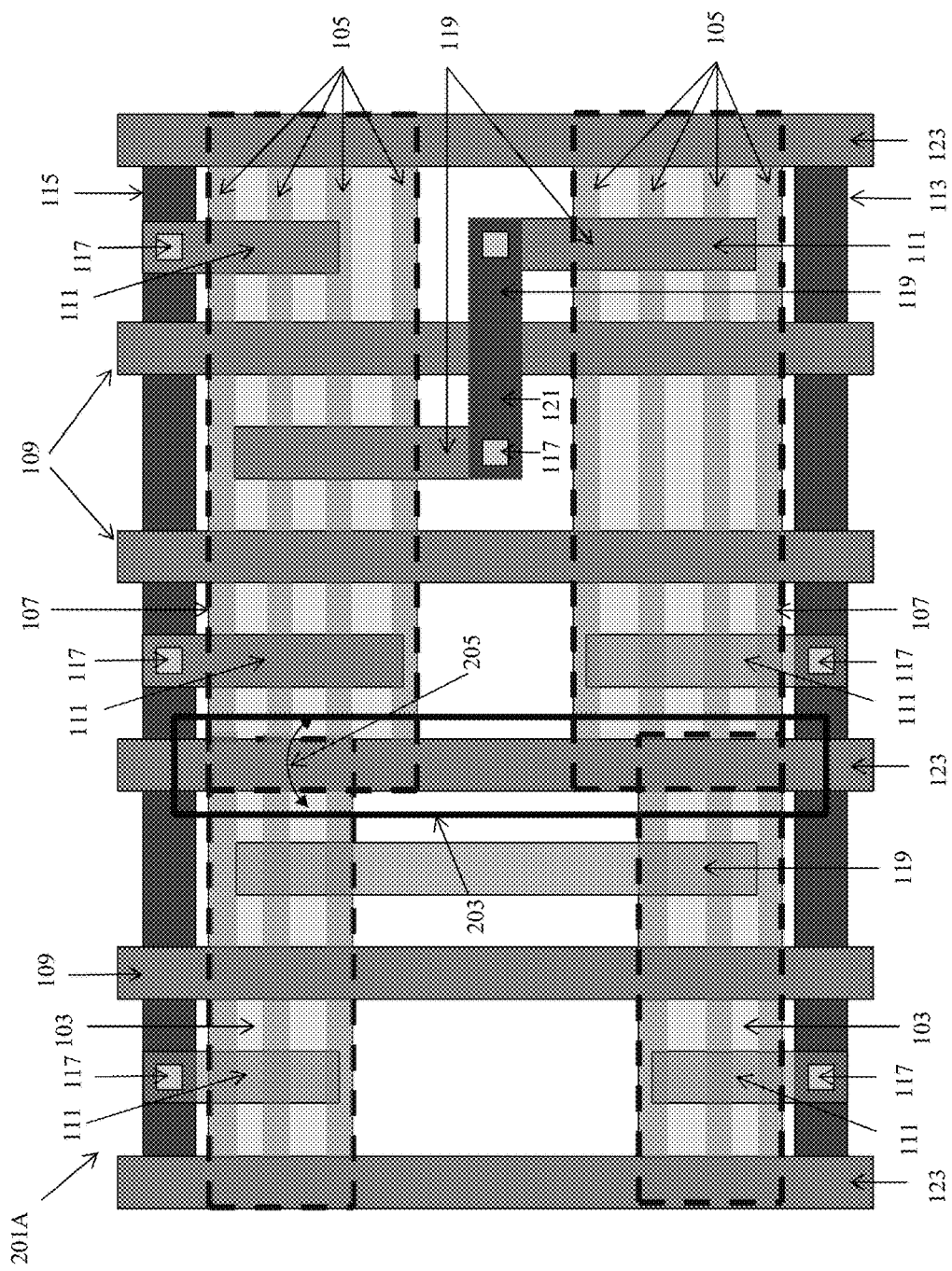
FIG. 2A illustrates a top-view of a standard abutted cell layout with a single diffusion break for a conventional FinFET device.
Figure 2B:
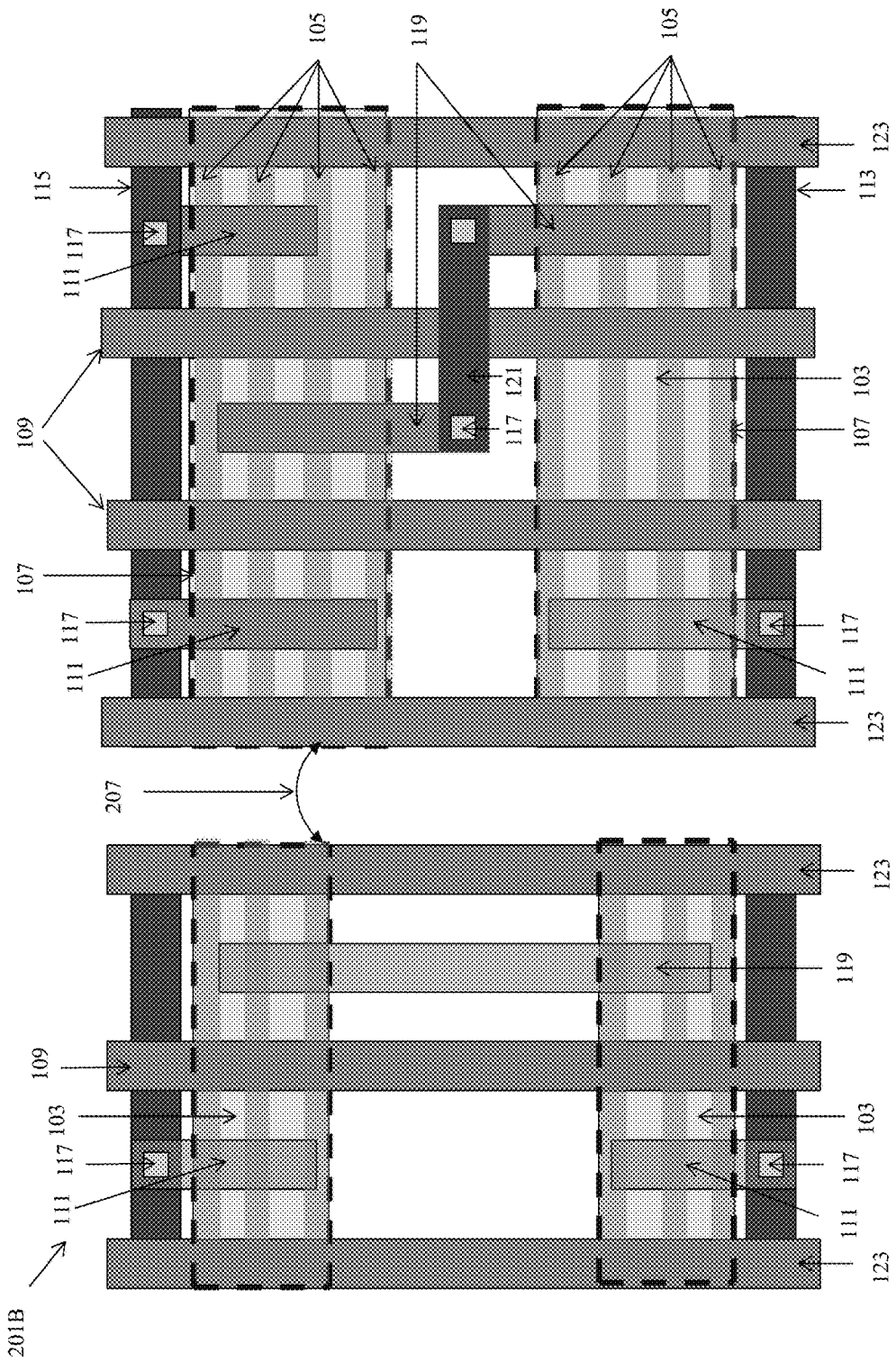
FIG. 2B illustrates a top-view of a standard abutted cell layout with a double diffusion break for a conventional FinFET device.
Figure 3A:
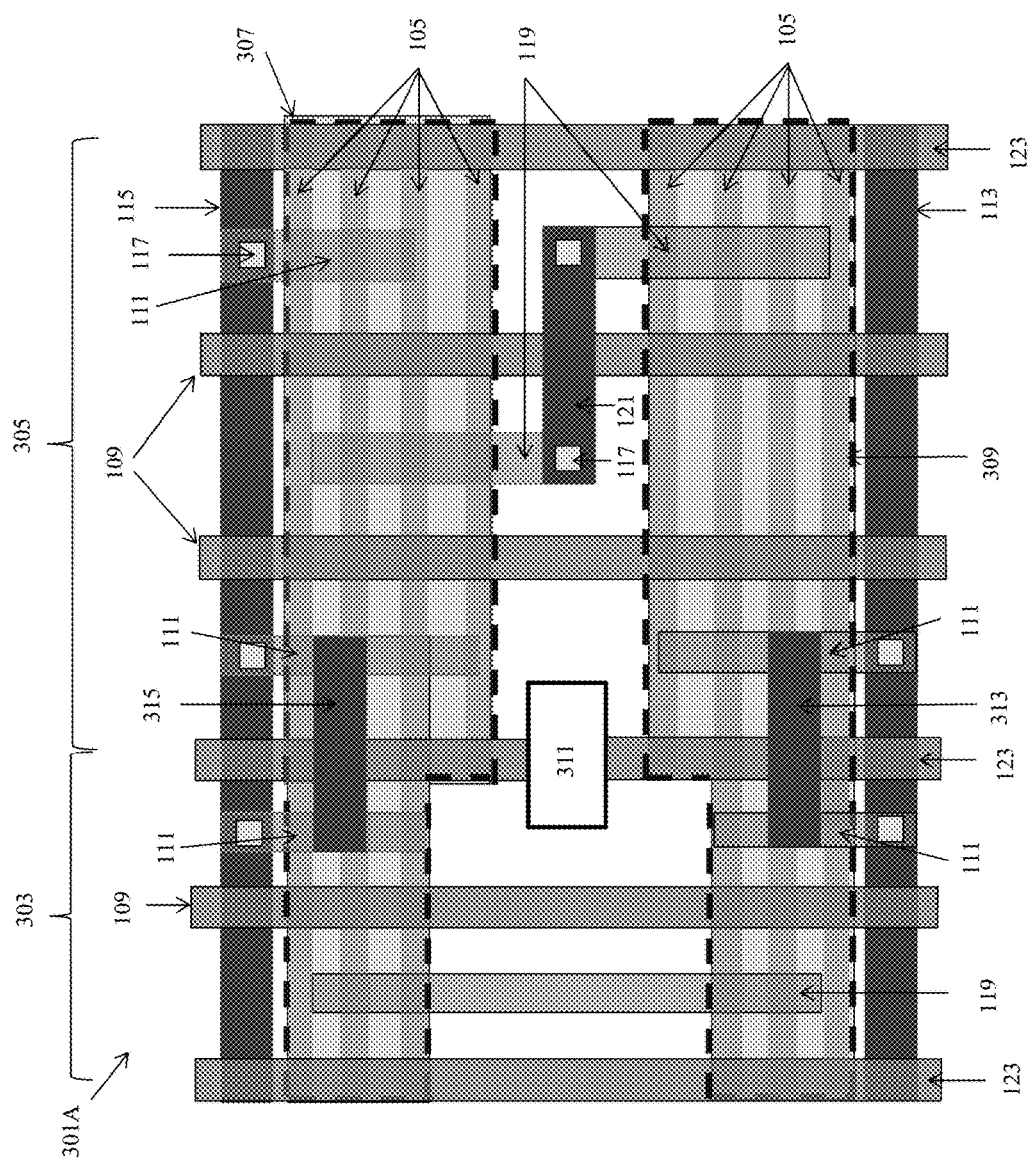
FIGS. 3A and 3B illustrate top-views of abutted standard cell layouts with a continuous non-uniform active region according to exemplary embodiments.

FIG. 3A illustrates a top-view of an abutted cell layout 301A with a continuous and non-uniform active region according to an exemplary embodiment. In this figure, a first cell 303 having a first source diffusion region and a first drain diffusion region is abutted to a second cell 305 having a second source diffusion region and a second drain diffusion region. The first diffusion regions may be smaller than the second diffusion regions for example, there may be three fins 105 present in the diffusion regions of the first cell 303, and four fins 105 present in the diffusion regions of the second cell 305.

A first dummy gate 123 is located between the boundary of the first cell 303 and the second cell 305. On each side of the first dummy gate 123 are interconnect structures 111 for the source voltage 113 and 115, which are part of the M1 layer. Second and third dummy gates 123 form the outer boundaries of the first and second cells, respectively. The cell layout 301A also includes active regions 307 and 309, three gate electrodes 109, vias 117, interconnect structures 119 for the drain voltage, and M1 layer segment 121.

In cell layout 301A, the first cell 303 and second cell 305 are abutted together to form a continuous drain diffusion region 307 having an upper portion and a lower portion that runs the entire width of the region and encompasses the entire drain diffusion region of the first cell 303. The continuous drain diffusion region 307 also has a lower portion, which begins at an edge of the first dummy gate 123, crosses dummy gate 123, and continues across the width of the diffusion region of the second cell 305. In addition, the first cell 303 and second cell 305 together form a continuous source diffusion region 309 having upper and lower portions that mirror the lower and upper portions, respectively, of drain diffusion region 307. A poly-cut mask 311 cuts the first dummy gate 123 between, but separated from, the continuous drain diffusion region 307 and the continuous source diffusion region 309. The first cell 303 and the second cell 305 are at the same potential.

The cell layout 301A further includes a first gate contact 313 across the first dummy gate 123 that connects structure 111 from the first cell 303 with structure 111 from the second cell, which in turn are connected to power line 113 in the M1 layer. A second gate contact 315 crosses the first dummy gate 123 and connects other structures 111 from the first and second cells, respectively, which in turn are connected to power line 115 in the M1 layer. The first cell 303 and the second cell 305 are at the same potential.

Figure 3B:
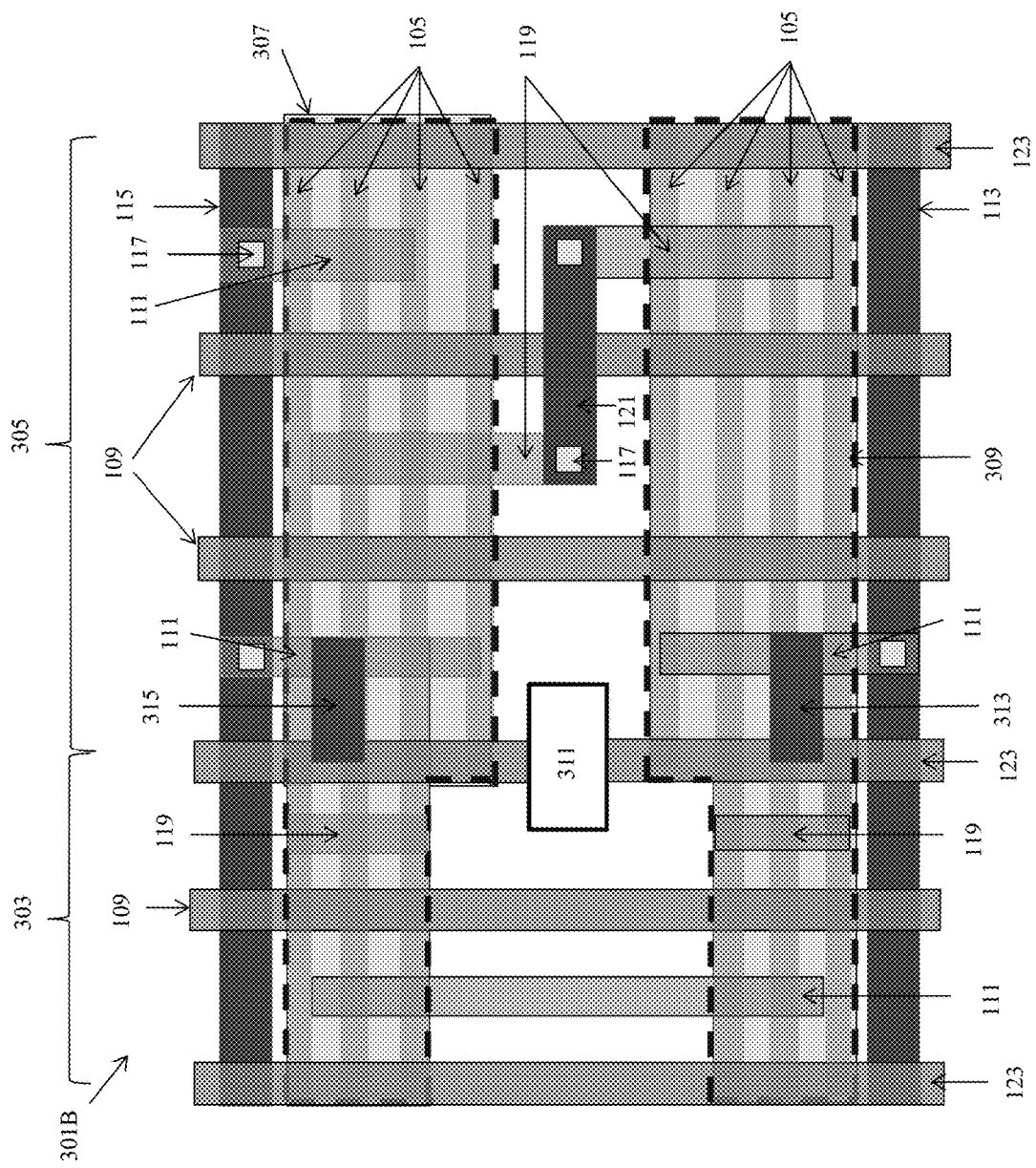

FIG. 3B illustrates a top-view of an abutted cell layout 301B with a continuous and non-uniform active region according to another exemplary embodiment. In this figure, a first cell 303 having a first source diffusion region and a first drain diffusion region is abutted to a second cell 305 having a second source diffusion region and a second drain diffusion region. A first dummy gate 123 is located between the boundary of the first cell 303 and the second cell 305. On one side of the first dummy gate 123 is an interconnect structure 111 for the source power line 113 which is part of the M1 layer. The interconnect structure 111 is connected to the middle of the dummy gate 123 by a first gate contact 313. The second gate contact 315 connects the midline of the dummy gate 123 to another structure 111, which in turn is connected to power line 115, which is part of the M1 layer. On the other side of the first dummy gate 123 are the interconnect structures 119 for the drain voltage. The first cell 303 and the second cell 305 are at the same potential.

Figure 4A:
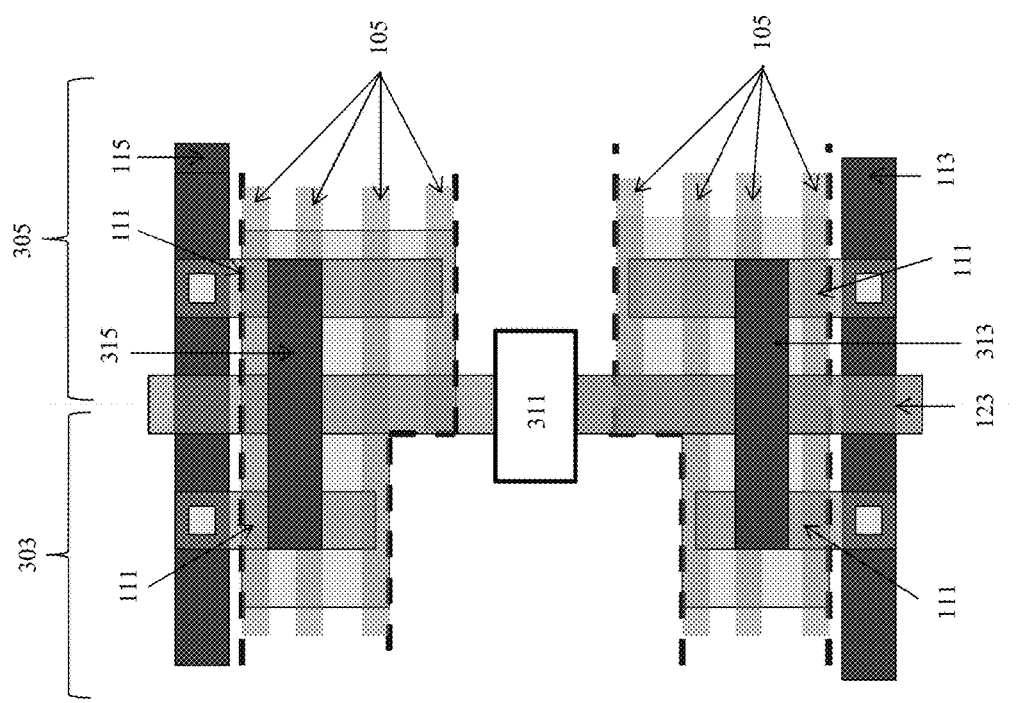
FIGS. 4A and 4B illustrate top-views of layouts for joined cells for double diffusion and single diffusion, respectively, according to another exemplary embodiment.

FIG. 4A illustrates a top-view of the abutted cell layout for double diffusion with a continuous and non-uniform active region, according to an exemplary embodiment. In this figure, the active region of the second cell 305 extends to the edge of the dummy gate 123, and the fins 105 are cut at the edge. The fin cut in FIG. 4A satisfies the design rule for fin cuts. A poly cut mask 311 cuts the dummy gate 123 between the source and drain regions.

Figure 4B:
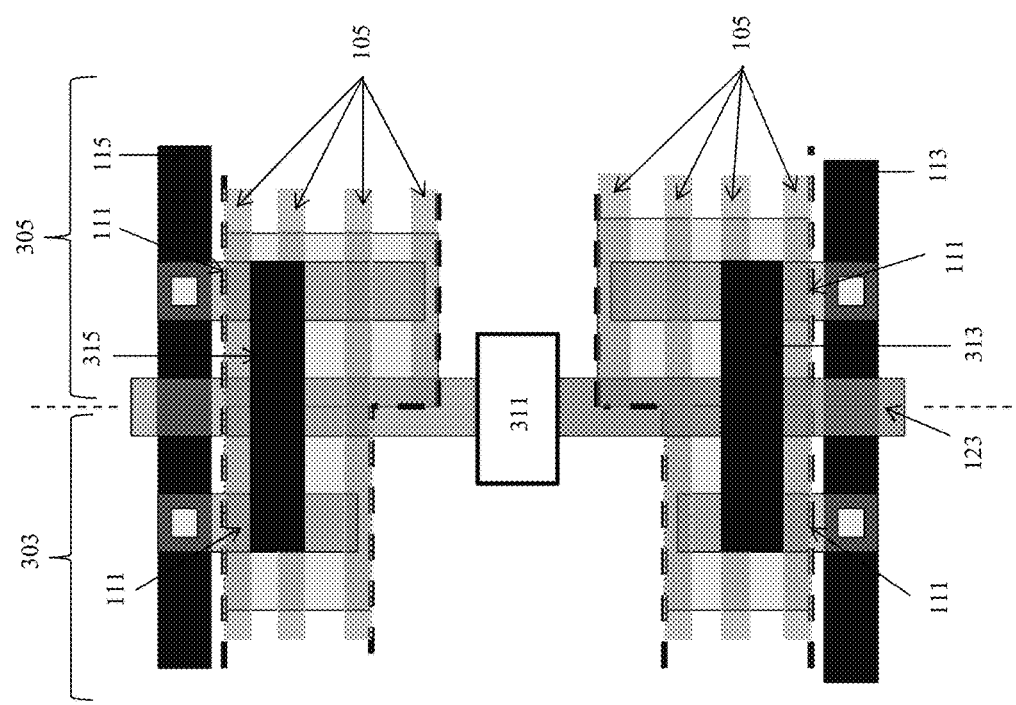

FIG. 4B illustrates a top-view of an abutted cell layout for single diffusion with a continuous and non-uniform active region according to an exemplary embodiment. In this figure, the active region is extended to the middle of dummy gate 123 and the fins 105 are cut at the center of the dummy gate 123. The jog in the active region violates the design rule for fin cuts, but leakage is not an issue since the two cells are at the same potential. Again, a poly-cut mask 311 cuts the dummy gate 123 between the source and drain regions.

The embodiments of the present disclosure can achieve several technical effects, such as providing methods and devices for abutting two cells with different sized diffusion regions without creating leakage issues and without increasing the area of the cell layout, thereby increasing the number of transistors for a FinFET device. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a first cell having a first drain diffusion region and a first source diffusion region and a second cell having a second drain diffusion region and a second source diffusion region, the first drain and source diffusion regions being smaller than the second drain and source diffusion regions;
a dummy gate at a boundary between the first and second cells;
a continuous drain diffusion region having an upper portion crossing the dummy gate and encompassing the entire first drain diffusion region and part of the second drain diffusion region and having a lower portion beginning over the dummy gate and encompassing a remainder of the second drain diffusion region;
a continuous source diffusion region having a lower portion crossing the dummy gate and encompassing the entire first source diffusion region and part of the second source diffusion region and having an upper portion beginning over the dummy gate and encompassing a remainder of the second source diffusion region; and
a poly-cut mask over the dummy gate between, but separated from, the continuous drain diffusion region and the continuous source diffusion region.

2. The device according to claim 1, wherein:
the lower portion of the continuous drain diffusion region and the upper portion of the continuous source diffusion region begin at an edge of the dummy gate and across the dummy gate, and
the first cell and the second cell are at the same potential.

3. The device according to claim 2, further comprising:
a first set of continuous fins across the upper portion of the continuous drain diffusion region;
a second set of continuous fins across the lower portion of the continuous source diffusion region;
a third set of fins across the lower portion of the continuous drain diffusion region; and
a fourth set of fins across the upper portion of the continuous source diffusion region.

4. The device according to claim 3, wherein the third and fourth sets are cut at the edge of the dummy gate.

5. The device according to claim 4, further comprising:
a first gate contact over the dummy gate connecting a first source power line interconnect from the first cell to a first source power line interconnect from the second cell; and
a second gate contact over the dummy gate connecting a second source power line interconnect from the first cell to a second source power line interconnect from the second cell.

6. The device according to claim 1, wherein the lower portion of the continuous drain diffusion region and the upper portion of the continuous source diffusion region begin in the middle of the dummy gate and continue across the dummy gate.

7. The device according to claim 6, further comprising:

a first set of continuous fins across the upper portion of the continuous drain diffusion region;

a second set of continuous fins across the lower portion of the continuous source diffusion region;

a third set of fins across the lower portion of the continuous drain diffusion region;

a fourth set of fins across the upper portion of the continuous source diffusion region.

8. The device according to claim 7, wherein the third and fourth sets are cut at the middle of the dummy gate.

9. The device according to claim 8, further comprising:

a first gate contact over the dummy gate connecting a first source power line interconnect from the first cell to a first source power line interconnect from the second cell; and a second gate contact over the dummy gate connecting a second source power line interconnect from the first cell to a second source power line interconnect from the second cell.

10. A device comprising:

a first cell having a first drain diffusion region and a first source diffusion region and a second cell having a second drain diffusion region and a second source diffusion region;

a dummy gate;

a continuous drain diffusion region having an upper portion crossing the dummy gate and encompassing the first drain diffusion region and a first part of the second drain diffusion region and having a lower portion beginning over the dummy gate and encompassing a second part of the second drain diffusion region; and a continuous source diffusion region having a lower portion crossing the dummy gate and encompassing the first source diffusion region and a first part of the second source diffusion region and having an upper portion beginning over the dummy gate and encompassing a second part of the second source diffusion region.

11. The device according to claim 10, further comprising:

a mask over the dummy gate between, but separated from, the continuous drain diffusion region and the continuous source diffusion region, wherein the dummy gate is formed at a boundary between the first and second cells.

* * * * *